(12) United States Patent
Comita et al.

(10) Patent No.: US 6,368,567 B2
(45) Date of Patent: Apr. 9, 2002

(54) POINT-OF-USE EXHAUST BY-PRODUCT REACTOR

(75) Inventors: Paul B. Comita, Menlo Park, CA (US); Rekha Ranganathan, Malden, MA (US); David K. Carlson, Santa Clara, CA (US); Dale R. DuBois, Los Gatos, CA (US); Hali J. L. Forstner, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/167,269

(22) Filed: Oct. 7, 1998

(51) Int. Cl.[7] .................................................. C01B 7/00
(52) U.S. Cl. ................... 423/240 R; 423/325; 423/344; 423/439; 423/462
(58) Field of Search .............................. 423/240 R, 325, 423/344, 439, 462

(56) References Cited

U.S. PATENT DOCUMENTS

| | | | |
|---|---|---|---|
| 5,154,773 A | | 10/1992 | Furusawa |
| 6,024,799 A | * | 2/2000 | Chen et al. ................. 118/715 |
| 6,194,628 B1 | * | 2/2001 | Pang et al. ................. 588/900 |

FOREIGN PATENT DOCUMENTS

| | | |
|---|---|---|
| EP | 59223294 | 1/1983 |
| EP | 0289858 | 4/1988 |
| EP | 01309315 | 8/1988 |
| EP | 0463 633 A1 | 6/1991 |
| EP | 0823279 A3 | 6/1997 |
| EP | 0823279 A2 | 6/1997 |

OTHER PUBLICATIONS

International PCT Search Report PCT/US99/23330.

* cited by examiner

*Primary Examiner*—Steven P. Griffin
*Assistant Examiner*—Maribel Medina
(74) *Attorney, Agent, or Firm*—Blakely Sokoloff Taylor & Zafman

(57) ABSTRACT

A method and an apparatus is provided for removing wafer processing by-products from gas fluid exhaust systems utilizing an energy source placed within an exhaust channel either alone or in combination with a cleaning gas. The placement of the energy source in an exhaust channel enables emitted energy to react with wafer processing by-products to convert the by-product residues to more removable forms. Additionally provided is a cleaning gas source internal to the exhaust channel to further react with and convert exiting by-product residues to gaseous fluids.

18 Claims, 5 Drawing Sheets

POINT-OF-USE EXHAUST BY-PRODUCT REACTOR

FIELD OF THE INVENTION

The present invention relates to the field of an apparatus for minimizing or eliminating by-product accumulation in the exhaust lines of reactors used for electronic device fabrication.

BACKGROUND OF THE INVENTION

Many of the films used in electronic device fabrication today are formed in deposition reactors similar to reactor 100 shown in FIG. 1. In deposition reactor 100, lamps 105 provide radiant heat to wafer 110 which is supported within reactor 100 by rotating susceptor 115. Process and cleaning gases are provided via gas inlet conduit 120 and inlet manifold 125. Gases are exhausted via exhaust manifold 130 and exhaust conduit 135. Exhaust conduit 135 is in communication with reactor 100 and the remaining exhaust systems 140 located within the wafer fabrication facility. Exhaust systems 140 may contain scrubbers, filtration units as well as other exhaust treatment systems.

During deposition and cleaning processes conducted with reactor 100, lamps 105, or alternative heat sources utilized by other types of semiconductor processing reactors, heat not only rotating susceptor 115 and wafer 110 but also gas inlet 125 and exhaust manifold 130. As a result, lamps 105 or other chamber heat sources also heat approximately 2–3 cm of exhaust conduit 135 located directly adjacent to exhaust manifold 130.

Additionally, hot gases exhausted by reactor 100 also heat conduit 135. Generally, as the processing temperature within reactor 100 increases the length of conduit 135 heated by hot exhaust gases increases. For example, in a deposition reactor 100 depositing silicon film by thermal CVD at, for example, 600 C., as much as about 2 to 3 feet of conduit 135 could be heated above room temperature or about 70 F. by exhausting deposition gases. Additionally, conduit 135 could be heated because of the cleaning processes used to clean reactor 100 after deposition. One representative cleaning process for the silicon deposition process described above is to raise reactor 100 above about 900 C. and inject HCl into reactor 100. The exhaust from such a high temperature cleaning process could be expected to raise the temperature of about 3–6 feet of conduit 135.

Referring to FIG. 1, that portion of exhaust conduit 135 heated by a combination of reactor heat sources, such as lamps 105, and heated reactor exhaust is labeled Zone A. Zone A is that portion of exhaust conduit 135 between exhaust manifold 130 and the dashed line, representing 2–3 cm beyond exhaust manifold 130, where hot exhaust gases as well as chamber heating sources, such as lamps 105, contribute to the heating of conduit 135.

Zone B of FIG. 1, shown between the dashed lines, represents that portion of conduit 135 heated by the hot exhaust gases of reactor 100. The temperature of conduit 135 within Zone B remains above the ambient temperature surrounding conduit 135. Zone B could include several feet of conduit 135 depending upon the temperature and flow rate of the exhausting gases. Zone C represents that portion of conduit 135 where the temperature is essentially the same as the surrounding ambient conditions.

Although conduit 135 within Zone B remains above the surrounding ambient temperature, at some point the temperature within conduit 135 decreases below the condensation points of the vapors contained in the exhaust of reactor 100. This condensation region, labeled CR on FIG. 1, delineates where gaseous by-products may condense to form deposits along the internal walls of conduit 135. Upstream of CR towards reactor 100, conduit 135 contains mostly vapor while downstream of CR conduit 135 contains a mixture of vapor and condensing by-products 145. Condensation continues within conduit 135 beyond condensation region CR so long as the temperature within conduit 135 remains below the condensation temperature of by-products 145. After condensation, many by-products will further polymerize along the interior walls of conduit 135. Reference number 145 indicates condensed, polymerized by-products formed along the interior walls of conduit 135.

Deposition processes conducted within reactor 100 result in desired deposits on substrate 110 as well as undesired film formation on internal surfaces and components of reactor 100. Additionally, some source gases, such as $SiH_4$ or chlorinated silanes from the previous example, exhaust unreacted from deposition reactor 100. As unreacted source gases exit reactor 100, temperatures within exhaust manifold 130 and exhaust conduit 135 within Zone A are typically high enough such that the unreacted gases can remain in the vapor phase. However, beyond the condensation region CR, unreacted source gases can also condense, polymerize and contribute to the accumulation of by-products 145 along the interior walls of conduit 135.

During the cleaning process, cleaning gases are introduced into reactor 100 to remove unwanted deposits from internal reactor components. As these deposits are removed from reactor 100 and are exhausted via exhaust manifold 130 into exhaust conduit 135, the unwanted deposit/cleaning gas mixture can behave similarly to the unreacted source gas. Within Zone A, a portion of the unwanted deposit/cleaning gas mixture remains gaseous, does not form deposits, condense or polymerize on the interior walls of exhaust conduit 135. As a result of the higher temperatures used during cleans, temperatures within Zone A and some of Zone B will be high enough such that a portion of the unreacted cleaning gas exhausting from reactor 100 will remain active. Thus, within that region where the unreacted cleaning gas remains active, the unreacted cleaning gas will be able to react with and remove by-products 145 deposited within that active cleaning gas area of conduit 135.

However, like the exhaust from the deposition process, the exhaust from the cleaning process will eventually cool within the condensation region CR, to a temperature where it is likely that most of the cleaning gas or gases will be inactive. Beyond CR, exhaust from the cleaning process will also contribute to the accumulation and further polymerization of by-products 145. Thus, within Zone A, reactor heating sources and high exhaust gas temperatures can result in sufficient temperatures within conduit 135 where most deposits formed will likely be removed by unreacted but still active cleaning gases. Within Zone B however, temperatures will likely not be high enough for any remaining unreacted cleaning gas to remain active. As described above, downstream of the condensation region, conditions within conduit 135 are such that the mixture of cleaning gas/by-product removed from Zone A, and the mixture of cleaning gas/deposits removed from reactor 100 can condense, polymerize and contribute to the accumulation of by-products 145 within conduit 135.

The problem currently faced by many types of reactors is the condensation and polymerization of unreacted source gas, cleaning gas/by-product mixture and cleaning gas/unwanted deposition mixture which result in the constant, gradual formation of highly viscous liquid or solid by-product 145 along the interior walls of exhaust conduit 135. As a result of this by product build up, exhaust conduit 135 becomes partially blocked thereby reducing reactor exhaust flow efficiencies and, in the case of reduced pressure systems, reducing vacuum pump performance. On a regularly occurring basis, by-product accumulation within conduit 135 becomes so substantial that the reactor 100 must stop production, exhaust conduit 135, or the blocked portion therein, must be disconnected from reactor 100 and the accumulated by-product removed.

These and other disadvantages of the prior art are overcome by the present invention directed to a method and an apparatus which can inhibit or eliminate by-product condensation and polymeric formation within exhaust lines. Such an apparatus minimizes exhaust line blockages, maximize reactor up-time, and enables longer time between service for reactor exhaust systems.

SUMMARY OF THE INVENTION

In accordance with the present invention, there is disclosed a method and apparatus for removing wafer processing by-products from a fluid conduit or exhaust channel which is attached to a substrate processing area by placing an energy source, such as heaters or UV lamps, within the exhaust channel. The placement of this energy source provides energy internal to an exhaust conduit such that the viscosity of polymeric by-products would be reduced whereby the by-product material can flow, or partially or fully vaporize, or recombine or react in the presence of a cleaning gas to form gaseous by-products. The resulting gaseous by-products can therefore be more expeditiously and completely removed by gaseous fluid exhaust systems. More precisely, the present invention is directed to an improved method and apparatus for adding energy internal to the exhaust conduit of a wafer processing reactor in order to minimize condensation and polymerization of deposition and cleaning by-products as well as promote more thorough removal of deposition and cleaning by-products from the reactor's exhaust system.

In an alternative embodiment of the present invention, a gas supply feature is provided to a fluid conduit exhaust channel in proximity to the energy source within the exhaust channel whereby a cleaning gas or combination of gases such as $Cl_2$, HCl, $ClF_3$, $F_2$, $NF_3$ or $O_3$, can be introduced into the exhaust channel. In this way, the cleaning gas or mixtures thereof can react or recombine with or otherwise break down by-products present within the conduit to form gaseous by-products which are more easily removed by exhaust treatment systems. With the addition of the gas supply feature, the cleaning gas or combinations of cleaning gases utilized in conjunction with the energy provided by the internal energy source provide an additional process which can be used to react, recombine, or otherwise break down by-products present within the exhaust conduit to form gaseous by-products.

A major objective of the present invention is that the energy and cleaning gas in the exhaust conduits of the present invention provide an opportunity to reduce the formation of solid or highly viscous by-products and convert by-products into less viscous or gaseous by-products within the gas fluid exhaust conduits of wafer processing systems. Minimizing by-product formation and accumulation within chamber exhaust systems leads to enhanced wafer throughput by reducing or eliminating the necessity of ceasing chamber operations to dissemble, remove by-product accumulations and re-install chamber exhaust lines. Wafer fabrication exhaust treatment system efficiency and ability to remove and properly dispose of chamber exhaust by-products are increased by providing methods and apparatuses which result in gaseous chamber by-product formation.

BRIEF DESCRIPTION OF THE DRAWINGS

Other objectives, features and advantages of the present invention will become apparent upon consideration of the specification and the drawings, in which.

DETAILED DESCRIPTION OF THE PRESENT INVENTION

Figure 1:
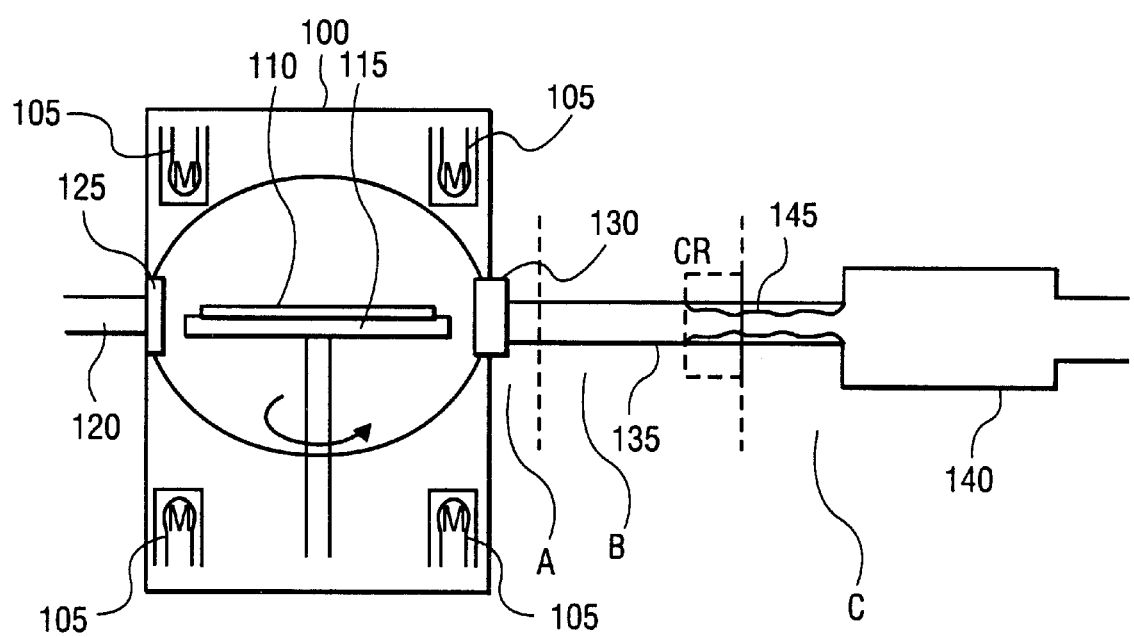
FIG. 1 is an illustration of a cross-sectional view of a conventional deposition apparatus and exhaust conduit.
Figure 2:
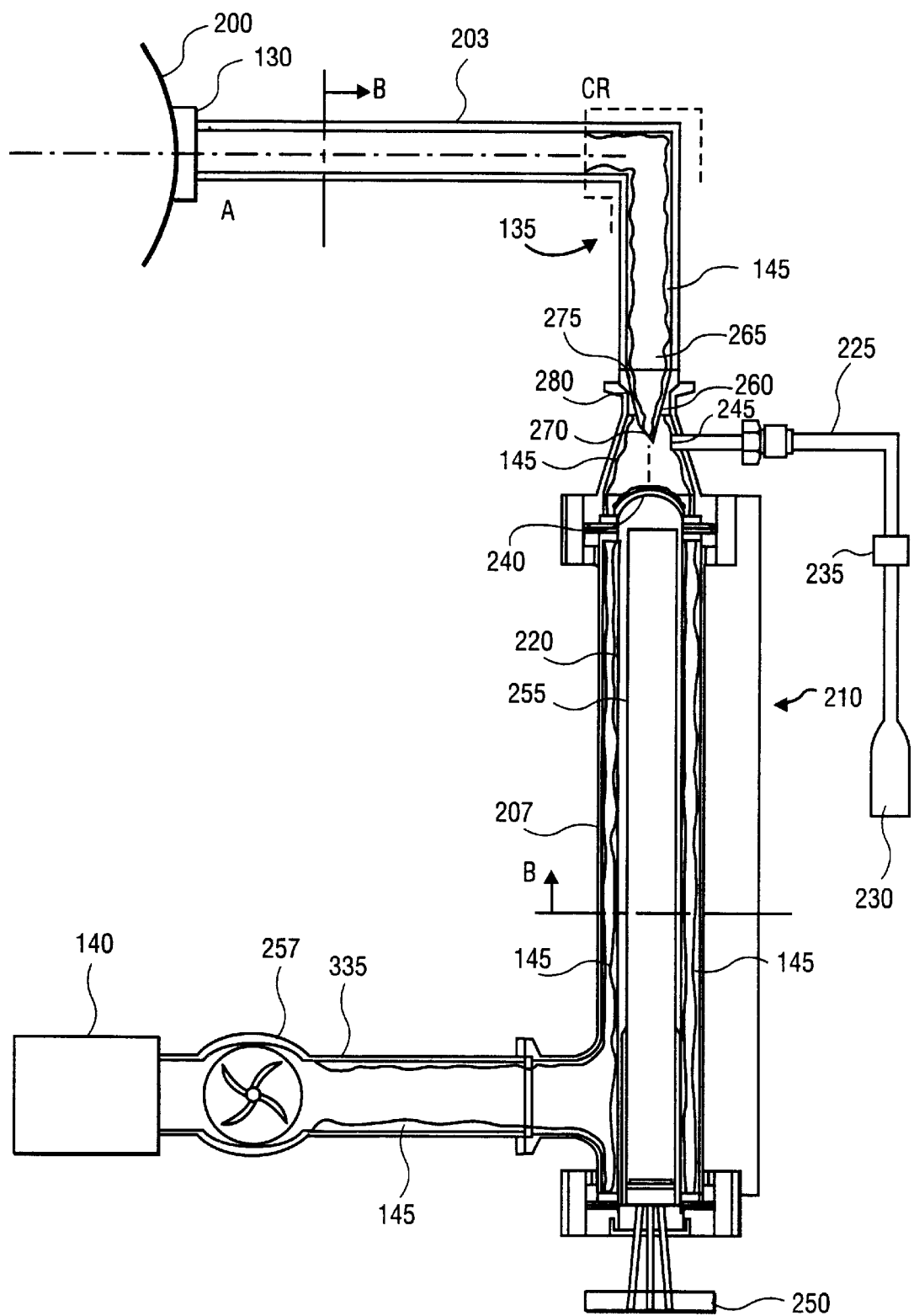
FIG. 2 is an illustration of a cross-sectional view of a representative apparatus of the present invention when the apparatus is a resistive heater which is not in operation.
Figure 3:
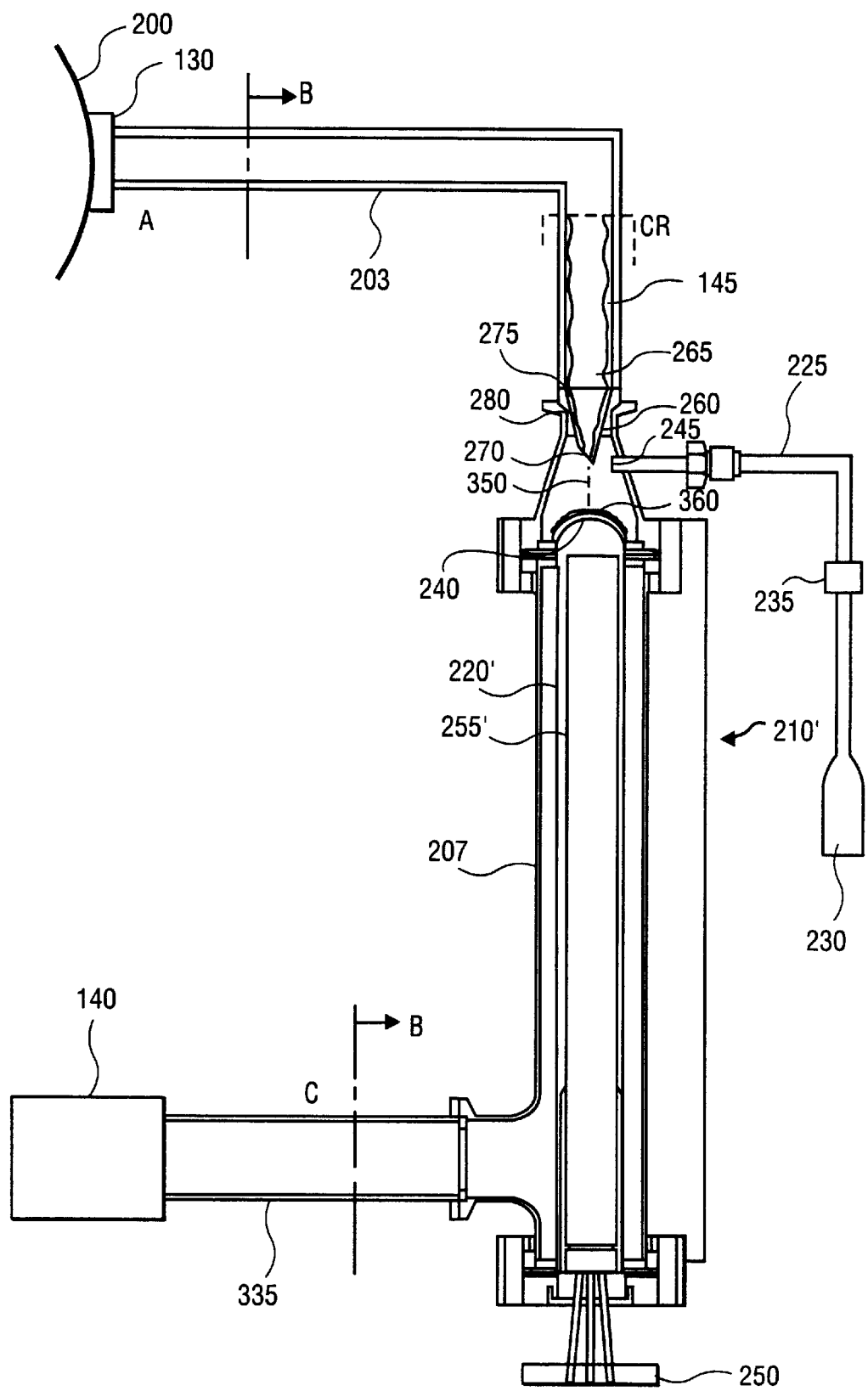
FIG. 3 is an illustration of a cross-sectional view of a representative apparatus of the present invention when the apparatus is in operation.
Figure 4:
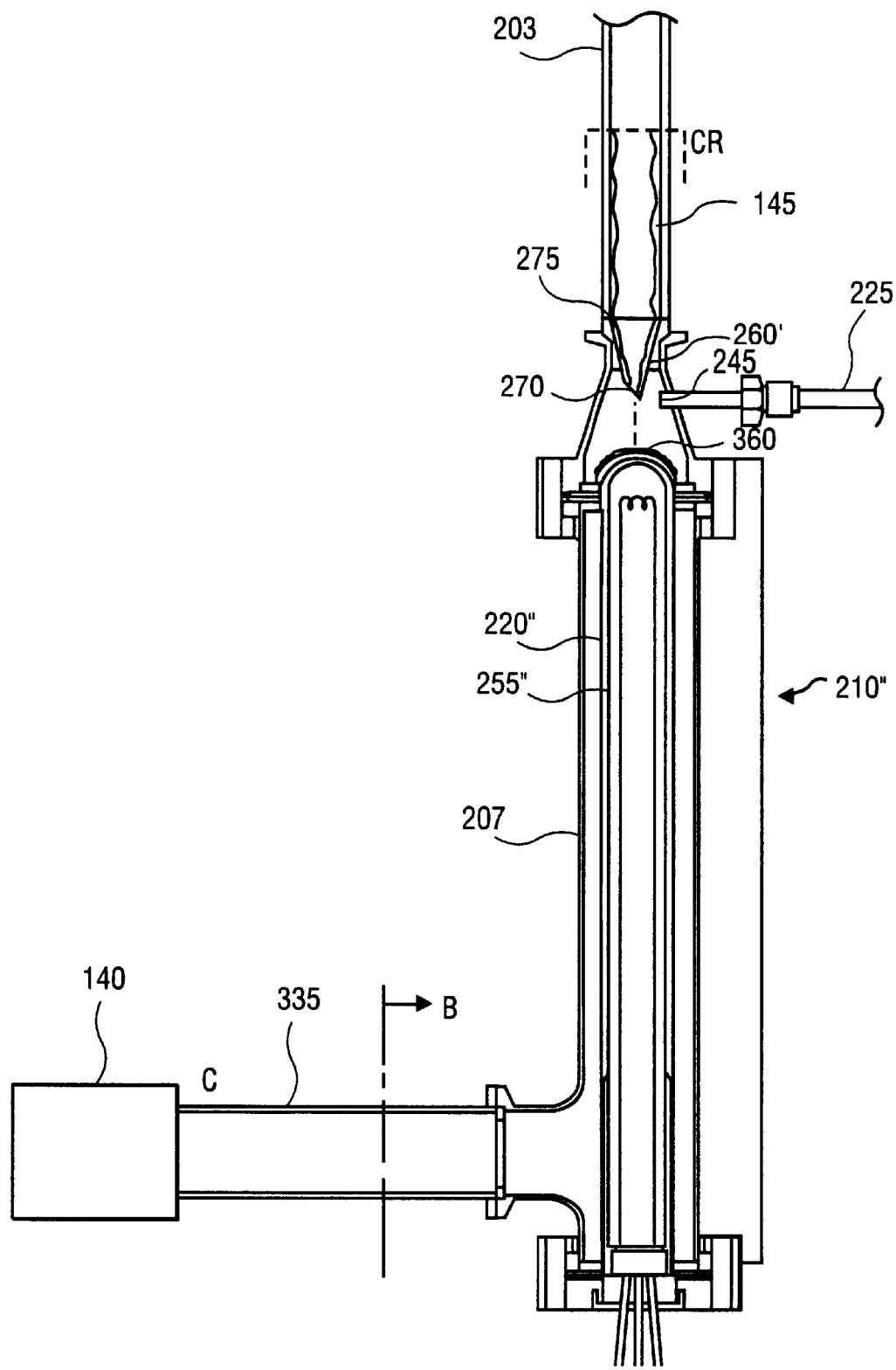
FIG. 4 is an illustration of a cross-sectional view of an alternative embodiment of the apparatus of the present invention wherein said embodiment is a radiant energy source.

FIG. 2 shows an embodiment of an apparatus for exhaust by-product removal according to the present invention when said apparatus is not in operation and exhaust by-products have accumulated. Referring to FIG. 2, one embodiment of the apparatus of the present invention is an internal energy device 210 disposed within the exhaust conduits of a deposition reactor 200. Exhaust conduits refers to any piping, passageway, or other channel coupled to a processing reactor for removing process by-products and by-product residues. Since the method and apparatus of the present invention are independent of the type of reactor utilized to generate the by-products, reactor 200 represents a wide variety of processing reactors such as the prior art thermal CVD reactor 100 but also other processing reactors such as but not limited to reduced pressure, single or multiple substrate susceptors or batch furnace type, or plasma deposition reactors. Disposed within central exhaust conduit 207 is internal energy device 210 which includes energy source 255 and casing 220. Upper exhaust conduit 203 is coupled to the reactor exhaust manifold 130 and central exhaust conduit 207. Lower exhaust conduit 335 is coupled to central exhaust conduit 207 and the wafer fabrication facilities exhaust system 140. The exhaust system shown in FIG. 2 represents a typical exhaust configuration for a reduced pressure semiconductor processing system in which pump 257 is in communication with chamber 200 via upper, central and lower exhaust conduits 203, 207 and 335 respectively. One of ordinary skill will appreciate that the method and apparatus of the present invention can also be practiced on atmospheric pressure semiconductor processing systems. In an atmospheric pressure system, pump 257 would be removed from lower exhaust conduit 335 between internal energy device 210 and wafer fabrication facility exhaust system 140. The exhaust systems shown in FIGS. 3 and 4 are atmospheric pressure systems.

An additional conduit 225 is attached to central exhaust conduit 207 in proximity to internal energy source casing 220 and downstream of directional insert 260. Downstream refers to the general flow pattern from reactor 200 to exhaust system 140 while upstream describes a flow in the opposite direction. Conduit 225 is in communication with central exhaust conduit 207 and is coupled to bulk gas supply 230. The bulk gas supply provides cleaning gas or other reactive gases used to react with and remove exhaust line by-products. One such cleaning gas is chlorine ($Cl_2$). One of ordinary skill will appreciate that the satisfactory results of the present invention can be achieved by utilizing other cleaning or reactive gases such as: HCl, $ClF_3$, $F_2$, $NF_3$, and $O_3$. Additionally, one of ordinary skill will appreciate that a plurality of additional conduits similar to conduit 225 and a plurality of bulk gas supplies similar to bulk gas supply 230 can be attached in proximity to internal energy device 210 in order to independently provide multiple cleaning gases according to the method of the present invention. Gas supplied from bulk gas supply 230 is controlled by flow controlling device 235. One such flow controlling device is a mass flow controller.

Casing 220 should be fabricated from material compatible with energy source 255. An additional material selection criteria for casing 220 includes the ability to withstand prolonged exposure to temperatures as low as about 25 C. or above about 1000 C in an oxygen deficient atmosphere and high volumes of semiconductor deposition and cleaning gases similar to the atmosphere expected in the exhaust of a semiconductor processing reactor 200. One representative material for the fabrication of casing 220 is stainless steel. Other suitable materials include: quartz, Inconel, Hastelloy, and other low iron content stainless steels such as Haynes 242. Irrespective of material selected, the size and shape of casing 220 minimizes any impact on gas flow efficiency within central exhaust conduit 207. Casing 220 will have a diameter less than the internal diameter of central exhaust conduit 207 while allowing sufficient clearance between the outer surface of casing 220 and the inner wall surface of central exhaust conduit 207. In one representative embodiment central exhaust conduit 207 may be fabricated from a low iron content stainless steel with an outer diameter of about 2.0 inches and a wall thickness of about 0.065 inches. Casing 220 may also be fabricated from a low iron content stainless steel with an outer diameter of approximately about 1.28 inches.

For simplicity casing 220 has been illustrated with a generally cylindrical shape having a circular cross section. One of ordinary skill will appreciate that the cross sectional shape of casing 220 could be square, rectangular, octagonal or any other shape which generally conforms with the shape of energy source 255 and does not adversely impact flow efficiencies within exhaust conduits 203, 207 and 335. One method of minimizing the impact on flow efficiencies is to have approximately equal cross sectional flow areas between central exhaust conduit 207 and lower exhaust conduit 335. For example, in a representative embodiment, central exhaust conduit 207 has an outer diameter of about 2.0 inches, a wall thickness of about 0.065 inches with source casing 220 having an outer diameter of about 1.28 inches which results in a cross sectional flow area within central exhaust conduit 207 of about 1.46 square inches. A representative lower exhaust conduit 335 with an outer diameter of 1.5 inches and a wall thickness of 0.065 inches results in a cross sectional flow area of about 1.47 square inches. One of ordinary skill will appreciate that varying the wall thickness of exhaust conduits 207 and 335 will alter the cross-sectional flow area of those exhaust conduits. For example, given the outer conduit diameters and casing 220 diameter above, a wall thickness of 0.08 inches results in a cross sectional flow area of about 1.3722 square inches in central conduit 207 and a cross-sectional flow area of about 1.4103 square inches in lower exhaust conduit 335. An exhaust conduit wall thickness of about 0.05 inches results in a central exhaust conduit cross sectional flow area of about 1.5485 square inches and a lower exhaust conduit flow area of about 1.5394 square inches. One of ordinary skill will appreciate that a variety of exhaust conduit outer diameters, wall thicknesses and source casing 220 diameters may be employed to maintain an approximately equal cross-sectional flow area or cross-sectional flow areas whose values are within about 0.04 square inches of each other between central and lower exhaust conduits 207 and 335.

As shown in FIG. 2, internal energy source 255 is enclosed within casing 220 and disposed internal to conduit 207. Energy source 255 imparts energy to surrounding components but more specifically to by-products 145 formed on the interior walls of conduit 207 in order to reduce the viscosity or cause the reaction, conversion, or degradation of by-products 145 whereby by-product residues are converted into more removable forms. Energy source 255 could be a resistive heater, a flame, a plasma generator, a photon generator, UV or IR lamps or any other energy source which reduces the viscosity of or results in the chemical recombination or conversion of by-products 145 formed within exhaust conduits 203, 207, and 335. In the specific embodiment of internal energy device 210 of FIG. 2, energy source 255 is a resistive heater. Controller 250 is used to adjust the energy output level from energy source 255.

In an embodiment of the present invention, energy source casing 220 is disposed internal to exhaust conduit 207 such that gas supply outlet 245 is in close proximity to casing tip 240. The proximity of outlet 245 to tip 240 is advantageous because when internal energy device 210 is in operation and exhaust by-products 145 come into direct contact with the elevated surface temperature of casing 220 or otherwise contact the energy provided by internal energy source 255 said by-products can vaporize, or otherwise react in proximity to the cleaning or reactive gas exiting fluid flow channel 225 via outlet 245. As a result of reacting or recombining with the energy provided by internal energy device 210 in the presence of a cleaning gas, a by-product could be formed into a more removable form such as, for example, one which remains gaseous until removed by the wafer fabrication facility exhaust system 140. Alternatively, energy from internal energy device 210 alone may be sufficient to result in the formation of by-products which remain in the vapor phase or other more removable form until removed by the wafer fabrication facility exhaust system 140.

One method of the present invention causes by-products 145 to recombine with a cleaning gas to convert exiting by-products into a more expeditiously removable and desired gaseous by-product. This by-product is desirous because it will remain in the vapor state within the temperature and pressure conditions of upper exhaust conduit 203 as well as central exhaust conduit 207 surrounding internal energy device 210 and lower exhaust conduit 335 until removed by exhaust treatment systems 140. As an example, given a representative by-product $A_2X_6$ where 2 A atoms are bonded together and 3 X atoms are bonded to each A atom. Vapor-phase by-product $A_2X_6$ condenses, polymerizes and forms $(A_2X_6)_n$ chains below, for example, 200 C. Thus, by-products of $A_2X_6$ will condense and polymerize into $A_2X_6$ chains along the walls of conduit 135 when the temperature within conduit 135 drops below 200 C. However, in the presence of cleaning gas R, the A—A bond of the $A_2X_6$ molecule is broken forming instead $AX_4$ which can remain in the vapor phase at or below ambient conditions surrounding exhaust conduits 203, 207 and 335. Typical ambient conditions would likely be room temperature of the wafer fabrication facility where the method and apparatus of the present invention are in use or about 70 F. Chlorosilane polymer by-products, such as $(Si_xCl_y)_n$ produced as a result of various types of silicon deposition processes, can behave similarly to the representative by-product $A_2X_6$ described above when the chlorosilane by-products are in the presence of chlorine. As a result of recombining or further reacting by-product $A_2X_6$, condensation and polymerization within upper, central and lower exhaust conduits 203, 207 and 335 is minimized and the likelihood increased that by-products formed within exhaust conduits will remain in the vapor phase until removed by exhaust treatment system 140.

In an alternative method of the present invention, the energy provided by internal energy device 210 alone results in the mechanism described above, specifically, the formation of a gaseous by-product which remains in the vapor phase until removed by the wafer fabrication facility exhaust system 140. In another alternative method of the present invention, processing by-products recombine as a result of the energy provided by internal energy device 210 to form a second by-product which then reacts with a cleaning gas to form a third by-product. The third by-product then remains in the vapor state until removed by the wafer fabrication facility exhaust system 140. In another alternative method of the present invention, processing by-products recombine with a cleaning gas to form a second by-product. The second by-product reacts or recombines as a result of the energy provided by internal energy device 210 to form a third by-product which remains in the vapor phase until removed by the wafer fabrication facility exhaust system 140. One of ordinary skill will appreciate that the process of recombining or reacting by-products with cleaning gas or energy from internal device 210 could continue for several iterations resulting in the formation of fourth, fifth or even sixth gaseous by-products or reduced viscosity by-products depending upon the type of original by-product formed, the type and level of energy provided by internal device 210 and the type and amount of cleaning gas provided.

Cone shaped directional insert 260 is also disposed internal to exhaust conduit 135 and is oriented within conduit 135 such that inlet 265 opens towards chamber 200 and vertex 270 opens towards internal energy device 210. Upper edge 275 of cone insert 260 is between about 0.5 and 1.25 inches in diameter or about 0.88 inches in diameter. Upper edge 275 forms a seal with the interior wall of upper exhaust conduit 203 such that all material within upper exhaust conduit 203 flows through cone insert 260. The cone shape of insert 260 is advantageous because the concave interior surface 280 of cone insert 260 gathers and directs liquefied exhaust by-products towards vertex 270. A cone shaped directional insert, similar to insert 260, would be approximately between about 0.25 and 1.25 inches long. The cone's inherent vertex 270 is another advantage of having a cone shaped directional insert. Concave interior surface 280 works in conjunction with vertex 270 and upper edge seal 275 to ensure that all liquefied by-products flow through directional insert 260 and gather at vertex 270. Vertex 270 has a circular opening approximately 0.5 inches in diameter. Alternatively, vertex 270 could have an elliptical shaped opening with approximately the same diameter.

One of ordinary skill in the art will recognize the advantages of a cone shaped directional insert but will also appreciate that alternative shapes may also provide advantageous interior surfaces for gathering and directing by-products within upper exhaust conduit 203. For example, an elongated cylinder within conduit 203 or a semicircular shape angled within conduit 203 could provide advantageous results as well. Additionally, directional insert 260 is advantageously situated such that vertex 270 is positioned directly above internal energy device 210. As a result of this advantageous placement, fluids exiting vertex 270 will be directed so as to impinge on casing 220 at tip 240. Directional insert 260 can be formed out of a corrosion resistant material compatible with the material of conduit 135. Materials suitable for the fabrication of casing 220 are quartz, Inconel, Hastelloy, and other low iron content stainless steels such as Haynes 242. An additional consideration for the fabrication of insert 260 is the compatibility of the material selected with the type of energy source 255 employed within the apparatus of the present invention. For example, if energy source 255 is a UV lamp, then both casing 220 and insert 260 could be formed from quartz or similar material transparent to UV energy such that UV energy from the lamp is transmitted through both casing 220 and insert 260 and into portions of upper exhaust conduit 203 located upstream of insert 260. Depending upon the type of internal energy source 255 employed as well as other factors such as the volume and temperature of exhaust from reactor 200, internal energy device 210 and insert 260 should be advantageously placed within the exhaust conduits such that condensation region or CR is proximate to insert 260 or between insert 260 and casing 220 of device 210.

Although the use of directional insert 260 has the advantages described above, one of ordinary skill in the art will appreciate that the advantageous results of the methods and apparatus of internal energy device 210 of the present invention can be obtained without the use of directional insert 260. In such a case, energy from an embodiment of internal energy source 255 alone or in combination with cleaning gas or gases provided via outlet 245 is sufficient to recombine or react by-products 145 into gaseous or less viscous by-products which are more easily removed by chamber 200 exhaust systems and wafer manufacturing facility exhaust systems 140.

FIG. 2 illustrates by product 145 formation within the apparatus of the present invention when internal energy device 210 is not in operation and no cleaning gas flows from conduit 225. As described in the prior art, Zone A exists to about 2–3 cm beyond exhaust manifold 130 where upper exhaust conduit 203 is heated by a combination of heat sources from reactor 200 and high temperature exhaust gases from processes conducted within reactor 200. Within Zone B, upper exhaust conduit 203 and a portion of central exhaust conduit 207 are heated by exhaust gases from reactor 200. Zone B, shown between the dashed lines and arrows in FIG. 2, extends from the downstream boundary of zone A where heat generated by reactor 200 becomes negligible to, depending on the temperature of the exhaust gas, a point along casing 220 where the temperature of the casing 220 and the interior of exhaust conduit 135 is about the same as the ambient temperature surrounding conduit 135. As in the prior art exhaust lines, a condensation region, CR, exists beyond which by-product 145 will form within exhaust conduits. When internal energy device 210 is not in operation, by-product 145 will form on components within conduits 203 and 207 down stream of CR such as insert 260, casing 220 and additional exhaust conduit 335.

FIG. 3 represents an embodiment of a method of the present invention when an apparatus of the present invention, energy source 255', is in operation. In an embodiment of the present invention, internal energy source 255' is a resistive heater and casing 220' is fabricated from non-corrosive stainless steel having a low iron content such as Hastelloy. In a specific embodiment of the present invention, internal energy source 255" could be an Inconel resistive heater such as a "fire-rod" type manufactured by and commercially available from Watlow, Inc. Typical power ratings for a resistive heater employed by the apparatus of the present invention are between about 1.0 and 2.5 kW.

Zone A exists as described in FIG. 2. Zone B similarly exists between the dashed lines and arrows indicated but note how the zone is extended into conduit 335 as a result of the additional energy provided by the resistive heater 255'. Additionally, internal energy device 210' will add energy to the region within Zone B surrounding casing 220' as well as above tip 240. As a result of energy provided by internal energy device 210', the temperature of directional insert 260 and exhaust conduit in proximity to interface 275 is sufficiently high whereby the vapor only portion of Zone B between the Zone A/Zone B interface and condensation region CR will be expanded whereby CR is located closer to inlet 265. Ideally internal energy device 210', insert 260 and outlet 245 of conduit 225 would be advantageously placed whereby the combination of heat from the hot exhaust gases of reactor 200 combined with energy from energy source 255' would result in a CR at or in proximity to inlet 265, or in some instances, the CR is completely removed. (See FIG. 5 below).

Internal energy device 210' similarly expands Zone B moving the Zone B/Zone C boundary such that a portion of conduit 335 remains above the ambient temperatures surrounding conduit 335. The distance between internal energy device 210' and exhaust system 140 could also be minimized thereby reducing the length of conduit 335 and increasing the likelihood that Zone B would extend to exhaust system 140. Alternatively, the energy output of device 210' could be raised wherein sufficient energy is provided into conduit 335 thus expanding Zone B into conduit 335 or to exhaust treatment systems 140.

Regardless of specific type of internal energy source 255, 255' or 255" employed, internal energy source 210 is intended to provide sufficient energy within exhaust conduits 203 and 207 to break down or react with deposition and cleaning by-products formed during operation of reactor 200 or similar reactors. By advantageous placement and operation of the apparatus of the present invention these by-products are broken down or reacted into secondary, tertiary and other combinations of by-products which remain in the vapor phase until removed by exhaust system 140. One of ordinary skill will appreciate that a variety of methods can be employed to react, recombine or otherwise remove by-products 145 within the various embodiments of the present invention.

Referring again to FIG. 3, one method and apparatus of by-product removal combines the energy supplied by internal energy device 210' with a cleaning gas provided via conduit 225. Energy source 255', a resistive heater, heats casing 220', insert 260 and conduit 203 above insert 260 which results in decreased viscosity of by-product 145 deposited above insert 260. As a result, by-product 145 flows toward and is gathered by directional insert 260. Vortex 270, advantageously placed above casing tip 240, directs fluid or liquid by-product or a steady stream 350 of by-product 145 onto the surface of casing 220' at tip 240.

The temperature of casing 220', as a result of internal energy source 255', is sufficient to further reduce the viscosity of the by-product such that the by-product spreads 360 across the tip 240 and sides of casing 220'. A portion of spread by-product 360 will vaporize, react with cleaning gas provided via outlet 245 and recombine to form a compound which remains in the vapor phrase until removed by exhaust treatment system 140.

The method and apparatus of the present invention provides for the use of energy to break down, recombine or react the undesired, highly viscous by-products into exhaustible, gaseous compounds which remain gaseous until disposed of by exhaust treatment systems 140. As described above, one method to achieve such a gaseous by-product utilizes both the energy from internal energy device 210 as well as cleaning gas supplied by conduit 225 via outlet 245. An alternative method of the present invention forms exhaustible, gaseous by-products utilizing only the energy provided by internal energy device 210 to cause recombination of by-products 145 and the resulting formation of an exhaustible, vapor-phase by-product.

In another embodiment of the present invention, by-products 145 break down and recombine to form an exhaustible, gaseous by-product as a result only of the presence of cleaning gas provided via outlet 245. In another alternative method of the present invention, by-products 145 break down and recombine to form a different, second by-product as a result of reacting with the cleaning gas provided via outlet 245. This second by-product then reacts and recombines forming a third by-product as a result of the energy provided by internal energy device 210. This third by-product then reacts and recombines with the cleaning gas to form the desired exhaustible, gaseous by-product which remains gaseous until removed by exhaust treatment systems 140. Some complex by-products may repeat several times the above listed cycle of reacting or recombining as a result of energy from device 210 and then recombining as a result of reacting or recombining with a cleaning gas before forming a gaseous, exhaustible by-product.

FIG. 4 represents an alternative apparatus of the present invention where internal energy source 255" of internal energy device 210" is a radiant energy source such as mercury vapor lamps, quartz halogen lamps, carbon arc lamps or other UV or IR energy sources. Casing 220" is fabricated from quartz or other material transparent to the radiant energy of source 255". Directional insert 260' could also be fabricated from material transparent to the radiant energy of source 255" to facilitate energy transfer between energy device 210" and by-products 145 within conduit 203 above insert 260'. Internal energy device 210" functions similarly to devices 210 and 210' described above in that the energy provided by internal energy source 255", e.g. radiant or UV energy, is sufficient alone or in combination with a cleaning gas provided via outlet 245 to react with and cause recombination of by-products 145 into exhaustible, gaseous by-products. Also as with devices 210 and 210", a cleaning gas provided via outlet 245 alone may be sufficient to cause the formation of exhaustible, gaseous by-products. Cleaning gas provided via outlet 245 may also cause second and third by-product formations which, as described above, may further react and recombine with a cleaning gas and radiant energy provided by internal energy device 210" to form exhaustible, gaseous by-products.

Figure 5:
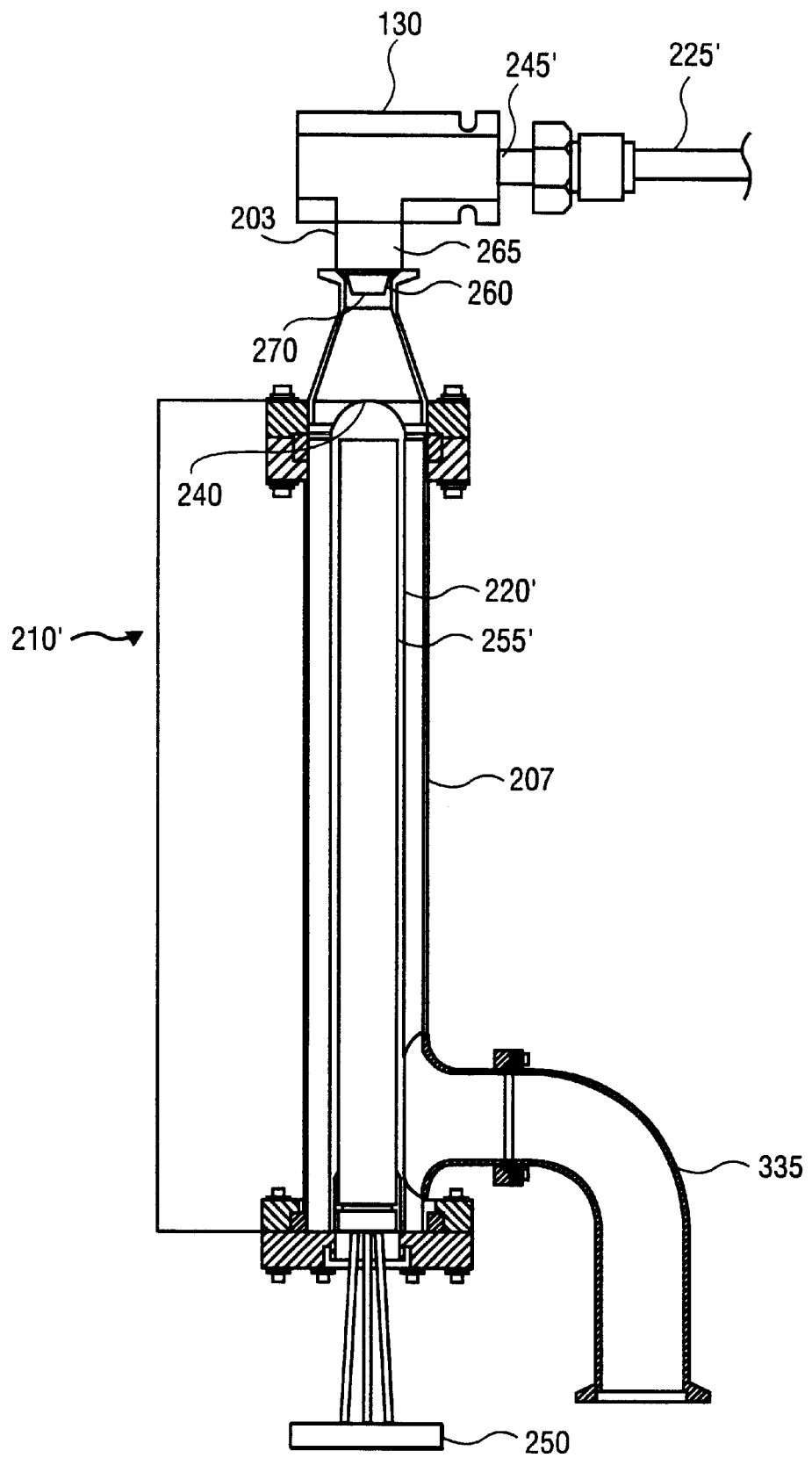
FIG. 5 is an illustration of a cross-sectional view of an alternative embodiment of the apparatus of the present invention which has eliminated the condensation region CR.

Turning now to FIG. 5, which as mentioned above, represents a cross sectional view of an embodiment of the present invention where internal energy device 210' is coupled sufficiently close to exhaust manifold 130 such that CR is elimnated. The length of upper exhaust conduit 203 is minimized such that internal energy device 210' is in close proximity to exhaust manifold 130. As a result, energy from internal energy device 210' recombines or reacts with exhaust by-products forming gaseous by-products as they exit exhaust manifold 130. A representative spacing between internal energy casing tip 240 and chamber 200 is between about 4 inches and about 8 inches or about 6.25 inches. FIG. 5 also illustrates the placement of conduit 255' above directional insert 260. Representative dimensions for directional insert 260 are about 0.62 inches long with an upstream diameter of about 0.88 inches and a downstream diameter of about 0.5 inches.

Like conduit 225, conduit 225' is coupled to bulk gas supply 230. The bulk gas supply provides cleaning gas used to react with and remove exhaust line by-products. One such cleaning gas is chlorine ($Cl_2$). One of ordinary skill will appreciate that the satisfactory results of the present invention can be achieved by utilizing other cleaning gases such as: HCl, $ClF_3$, $F_2$, $NF_3$, and $O_3$. Additionally, one of ordinary skill will appreciate that a plurality of additional conduits similar to conduit 225' and a plurality of bulk gas supplies similar to bulk gas supply 230 can be attached in proximity to exhaust manifold 130 in order to independently provide multiple cleaning gases according to the method of the present invention. As with conduit 225, gas supplied to conduit 225' from bulk gas supply 230 is controlled by flow controlling device 235. One such flow controlling device is a mass flow controller. Placing outlet 245' of conduit 225' upstream of directional insert 260 and directly into exhaust manifold 130 allows a cleaning gas, such as chlorine ($Cl_2$), to mix with, recombine or break down cleaning and deposition by-products almost immediately after said by-products enter exhaust manifold 130.

The dimensions of internal energy source 210', central and lower exhaust conduits 207 and 335 are preferentially selected to minimize interference with gas flow and not result in excessive back pressure in chamber 200. One method of minimizing gas flow interference and preventing back pressure is to obtain nearly equal cross-sectional flow areas between central exhaust conduit 207 and lower exhaust conduit 335. Representative dimensions of casing 220' of internal energy device 210' is about 14.5 inches in length, and about 1.28 inches in diameter. Central exhaust conduit 207 has representative dimensions of an outer diameter of about 2.0 inches and a wall thickness of about 0.065 inches. These representative dimensions result in a cross-sectional flow area within central exhaust conduit 207 of about 1.46 square inches. Representative dimensions of lower exhaust conduit 335 are an outer diameter of about 1.5 inches and a wall thickness of about 0.065 inches which results in a cross sectional flow area of about 1.47 square inches. Thus, by advantageously selecting the dimensions of conduits 207 and 335 and casing 220', a nearly constant cross sectional flow area between central exhaust conduit 207 and lower exhaust conduit 335 is achieved which results in minimized adverse impact on gas flow and chamber back pressure.

Thus, it is apparent that there has been provided, in accordance with the present invention, methods and apparatuses which minimize or inhibit by-product condensation and polymeric formation within reactor exhaust conduits that meet the objects and advantages set forth above. While specific embodiments of the invention have been shown and described, further modifications and improvements will occur to those skilled in the art. It is desired that it be understood, therefore, that this invention is not limited to the particular forms shown and is intended in the appended claims to cover all modifications which do not depart from the spirit and scope of the invention.

We claim:

1. A method of removing organic and polymeric wafer processing by-products from an exhaust channel of a wafer processing device comprising the steps of:
   (a) imparting sufficient energy from an energy source internal to an exhaust channel to by-products, as said by-products exit a wafer processing device through the exhaust channel, to form gaseous by-products, thus reducing or eliminating existing deposits and the formation of additional deposits along substantially the entire length of the ehxaust channel; and
   (b) removing said gaseous by-products from said exhaust channel.

2. The method of claim 1, wherein said wafer processing by-products impinge upon said energy source.

3. A method of removing organic and polymeric wafer processing by-products from exhaust conduits said method comprising the steps of:
   (a) treating a wafer processing by-product within a processing chamber exhaust conduit, as said by-products exit said processing chamber, with an energy source to form a converted by-product;
   (b) reacting said converted by-product with a cleaning gas to form a second converted gaseous by-product, thus reducing or eliminating the formation of deposits along substantially the entire length of the exhaust channel; and
   (c) exhausting said gaseous by-product from said processing chamber exhaust conduit.

4. The method of claim 3 wherein said cleaning gas is selected from the group consisting of: $Cl_2$, HCl, $ClF_3$, $F_2$, $NF_3$ and $O_3$.

5. The method of claim 3, where said wafer processing by-products impinge upon said energy source.

6. A method of removing organic and polymeric wafer processing by-products from an exhaust channel of a wafer processing device comprising:
   (a) imparting sufficient thermal energy from an energy source internal to an exhaust channel to by-products, as said by-products exit a wafer processing device through the exhaust channel, to form gaseous by-products, thus reducing or eliminating the formation of deposits along substantially the entire length of the exhaust channel; and
   (b) removing said gaseous by-products from said exhaust channel.

7. A metod of removing organic and polymeric wafer processing by-products from an exhaust channel of a wafer processing device comprising:
   (a) imparting sufficient light energy from an energy source internal to an exhaust channel to by-products, as said by-products exit a wafer processing device through the exhaust channel, to form gaseous by-products, thus reducing or eliminating the formation of deposits along substantially the entire length of the exhaust channel; and
   (b) removing said gaseous by-products from said exhaust channel.

8. A method for preventing organic and polymeric processing residues from accumulating within an exhaust channel of a wafer processing chamber, the method comprising:
   (a) performing a process within said wafer processing chamber, thereby generating a first chemical by-product of said process;

(b) providing an energy source internal to said exhaust channel;

(c) directing said first chemical by-product from said wafer processing chamber into said exhaust channel;

(d) imparting sufficient thermal energy from said energy source to said first chemical by-product, as said first chemical by-product enters said exhaust channel, to decompose said first chemical by-product into a second chemical by-product; and (e) removing said second chemical by-product from said exhaust channel, thereby reducing or eliminating the formation of deposits along substantially the entire length of the exhaust channel.

9. The method of claim 8, wherein said first chemical by-product is the result of a wafer processing operation.

10. The method of claim 8, wherein said first chemical by-product is the result of a chamber cleaning operation.

11. The method of claim 8, wherein said second chemical by-product is in a gaseous state.

12. A method for preventing organic and polymeric processing residues from accumulating within an exhaust channel of a wafer processing chamber, the method comprising:

(a) performing a process within said wafer processing chamber, thereby generating a first chemical by-product of said process;

(b) providing an energy source internal to said exhaust channel;

(c) directing said first chemical by-product from said wafer processing chamber into said exhaust channel;

(d) imparting sufficient light energy from said energy source to said first chemical by-product, as said first chemical by-product enters said exhaust channel, to decompose said first chemical by-product into a second chemical by-product; and (e) removing sid second chemical by-product from said exhaust channel, thereby reducing or eliminating the formation of deposits along substantially the entire length of the exhaust channel.

13. The method of claim 12, wherein said first chemical by-product is the result of a wafer processing operation.

14. The method of claim 12, wherein said first chemical by-product is the result of a chamber cleaning operation.

15. The method of claim 12, wherein said second chemical by-product is in a gaseous state.

16. A method of removing organic and polymeric processing residues from an exhaust channel of a wafer processing chamber, the method comprising:

(a) performing a process within said wafer processing chamber, thereby generating a first chemical by-product of said process;

(b) directing said first chemical by-product from said wafer processing chamber into said exhaust channel;

(c) treating said first chemical by-product with energy from an energy source, as said first chemical by-product enters said exhaust channel, to form a second chemical by-product;

(d) reacting said second chemical by-product with a cleaning gas to form a third chemical by-product;

(e) reacting said third chemical by-product with said organic and polymeric processing residues in said exhaust channel to form at least one chemical by-product in a gaseous state; and (f) exhausting said gaseous state by-product from exhaust channel, thereby reducing or eliminating organic and polymeric processing residues along subsantially the entire length of said exhaust channel.

17. A method for preventing organic and polymeric processing residues from accumulating within an exhaust channel of a wafer processing chamber, the method comprising:

(a) performing a process within said wafer processing chamber, thereby generating a first chemical by-product of said process;

(b) directing said first chemical by-product from said wafer processing chamber into said exhaust channel;

(c) reacting said first chemical by-product with a cleaning gas, as said first chemical by-product enters said exhaust channel, to form a second chemical by-product;

(d) treating said second chemical by-product with energy from an energy source to form a third chemical by-product; and (e) removing said third chemical by-product from said exhaust channel, thereby reducing or eliminating the formation of deposits along substantially the entire length of the exhaust channel.

18. A method of removing organic and polymeric processing residues from an exhaust channel of a wafer processing chamber, the method comprising:

(a) performing a process within said wafer processing chamber, thereby generating a first chemical by-product of said process;

(b) directing said first chemical by-product from said wafer processing chamber into said exhaust channel;

(c) reacting said first chemical by-product with a cleaning gas, as said first chemical by-product enters said exhaust channel, to form a second chemical by-product;

(d) treating said second chemical by-product with energy from an energy source to form a third chemical by-product;

(e) reacting said third chemical by-product with said organic and polymeric processing residues in said exhaust channel to form at least one chemical by-product in a gaseous state; and (f) exhausting said gaseous state by-product from said exhaust channel.

* * * * *